(12) United States Patent
Bang et al.

(10) Patent No.: US 11,764,252 B2
(45) Date of Patent: Sep. 19, 2023

(54) DISPLAY DEVICE

(71) Applicant: SAMSUNG DISPLAY CO., LTD., Yongin-si (KR)

(72) Inventors: Ki Ho Bang, Hwaseong-si (KR); Won Suk Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 231 days.

(21) Appl. No.: 17/081,541

(22) Filed: Oct. 27, 2020

(65) Prior Publication Data

US 2021/0313387 A1 Oct. 7, 2021

(30) Foreign Application Priority Data

Apr. 1, 2020 (KR) .................. 10-2020-0039940

(51) Int. Cl.
| | |
|---|---|
| *H01L 27/15* | (2006.01) |
| *H01L 33/12* | (2010.01) |
| *H01L 33/48* | (2010.01) |
| *H01L 33/54* | (2010.01) |
| *H01L 33/62* | (2010.01) |
| *H01L 25/075* | (2006.01) |
| *H01L 25/16* | (2023.01) |
| *H01L 33/52* | (2010.01) |
| *H01L 27/12* | (2006.01) |
| *H01L 33/36* | (2010.01) |
| *H01L 33/44* | (2010.01) |

(52) U.S. Cl.
CPC ............ *H01L 27/156* (2013.01); *H01L 33/12* (2013.01); *H01L 33/486* (2013.01); *H01L 33/54* (2013.01); *H01L 33/62* (2013.01)

(58) Field of Classification Search
CPC .... H01L 27/3258; H01L 27/156; H01L 33/12
See application file for complete search history.

(56) References Cited

U.S. PATENT DOCUMENTS

| 10,514,724 B2 | 12/2019 | Hamburgen et al. |
| 2019/0012031 A1* | 1/2019 | Kim .................. H10K 50/84 |

FOREIGN PATENT DOCUMENTS

| JP | 2009-110873 | 5/2009 |
| KR | 10-1796813 | 11/2017 |
| KR | 10-2018-0005323 | 1/2018 |
| KR | 10-1992452 | 6/2019 |
| KR | 10-2019-0119244 | 10/2019 |

* cited by examiner

*Primary Examiner* — Antonio B Crite

(74) *Attorney, Agent, or Firm* — F. Chau & Associates, LLC

(57) ABSTRACT

A display device includes a display panel having a display area and a bending region. The display panel includes a light emitting diode disposed in the display area. An encapsulation layer encapsulates the light emitting diode. A light-control pattern is disposed on the encapsulation layer. The light-control pattern includes a passivation layer and a flattening layer. The flattening layer extends from the display area to the bending region. A bending protection layer is disposed in the bending region. The bending protection layer is composed of a portion of the flattening layer in the bending region.

19 Claims, 7 Drawing Sheets

DISPLAY DEVICE

CROSS-REFERENCE TO RELATED APPLICATION

This application claims priority under 35 U.S.C. § 119 to Korean Patent Application No. 10-2020-0039940, filed on Apr. 1, 2020 in the Korean Intellectual Property Office, the disclosure of which are incorporated by reference in its entirety herein.

1. TECHNICAL FIELD

This present inventive concepts relate to a display device.

2. DISCUSSION OF RELATED ART

A display device such as a light emitting display device is applied to various electronic devices, such as a smart phone, a mobile phone, a tablet PC, or a multimedia terminal. Since the screen of the display device is exposed to the outside in the electronic device, the display device is a key element in the design of the electronic device.

The display device may include a display panel manufactured by forming pixels and circuit elements for driving the pixels on a substrate. A glass substrate may be used as the substrate for the display panel. However, glass substrates are relatively heavy, are easily broken, and are difficult to deform. Recently, a display panel has been developed that includes a flexible substrate that is relatively light, strong against impact, and is easily deformed.

A display panel that includes the flexible substrate may be designed such that a pad portion in which pads for inputting and outputting signals are arranged may be bent to be disposed on a rear surface of the display panel. Accordingly, a dead space of the display device may be reduced and a screen-to-body ratio of the display device may be increased.

A bending region of the display panel may be configured to bend with a small radius of curvature to increase the utilization of an inner space of the display device and to provide a more compact display device. However, a relatively small radius of curvature of the bending region increases the chances that wires disposed in the bending region may be damaged when the display panel is bent. A bending protection layer may be formed in the bending region to protect the bending region from impact and to relieve stress of wires disposed in the bending region.

SUMMARY

Embodiments provide a display device including a bending protection layer in a bending region of a display panel.

According to an embodiment of the present inventive concepts, a display device includes a display panel having a display area and a bending region. The display panel includes a light emitting diode disposed in the display area. An encapsulation layer encapsulates the light emitting diode. A light-control pattern is disposed on the encapsulation layer. The light-control pattern includes a passivation layer and a flattening layer. The flattening layer extends from the display area to the bending region. A bending protection layer is disposed in the bending region. The bending protection layer is composed of a portion of the flattening layer in the bending region.

In an embodiment, the flattening layer may continuously extend from the display area to the bending region.

In an embodiment, the display device may further include an integrated circuit chip mounted on the display panel, wherein the bending region may be disposed between the display area and the integrated circuit chip, and an edge of the flattening layer may be disposed between the bending region and the integrated circuit chip.

In an embodiment, the passivation layer may have an opening overlapping a light emitting region of the light emitting diode, and the flattening layer may fill the opening and be disposed on the passivation layer.

In an embodiment, the display panel may further includes a buffer layer disposed between the encapsulation layer and the passivation layer, and the flattening layer may contact a lateral surface of the passivation layer and an upper surface of the buffer layer in the opening.

In an embodiment, the flattening layer may cover a lateral surface of the passivation layer adjacent to the bending region.

In an embodiment, the flattening layer may cover a lateral surface of the encapsulation layer adjacent to the bending region.

In an embodiment, the display panel may further include a buffer layer disposed on the encapsulation layer and a touch electrode disposed on the buffer layer, and the passivation layer may cover the touch electrode.

In an embodiment, the bending protection layer may be an uppermost layer in the bending region.

In an embodiment, the passivation layer may not overlap the bending region.

According to an embodiment of the present inventive concepts, a display device includes a substrate having a display area and a non-display area. The non-display area includes a bending region. A light emitting diode is disposed in the display area. An encapsulation layer covers the display area to encapsulate the light emitting diode. A flattening layer is disposed on the encapsulation layer in the display area and includes an organic material. The flattening layer continuously extends from the display area to the bending region. A bending protection layer covers the bending region. The bending protection layer is composed of the flattening layer in the bending region.

In an embodiment, the display device may further include an integrated circuit chip disposed in the non-display area, wherein the bending region may be disposed between the display area and the integrated circuit chip, and an edge of the flattening layer may be disposed between the bending region and the integrated circuit chip.

In an embodiment, the display device may further include a passivation layer that is disposed between the encapsulation layer and the flattening layer and has an opening overlapping a light emitting region of the light emitting diode, wherein the flattening layer may include a portion disposed in the opening.

In an embodiment, the display device may further include a buffer layer disposed between the encapsulation layer and the passivation layer, wherein the flattening layer may contact a lateral surface of the passivation layer and an upper surface of the buffer layer in the opening.

In an embodiment, the flattening layer may cover a lateral surface of the passivation layer and a lateral surface of the encapsulation layer adjacent to the bending region.

In an embodiment, the display device may further include a buffer layer disposed on the encapsulation layer, and a touch electrode disposed on the buffer layer, wherein the passivation layer may cover the touch electrode.

In an embodiment, the passivation layer and the buffer layer may not overlap the bending region.

In an embodiment, the bending protection layer may be an uppermost layer in the bending region.

In an embodiment, the display device may further include a connecting wire disposed in the bending region, and an organic insulating layer disposed between the connecting wire and the bending protection layer in the bending region.

In an embodiment, the organic insulating layer may be formed of the same material as an organic insulating layer disposed between the substrate and the encapsulation layer in the display area.

According to embodiments of the present inventive concepts, a bending protection layer may be formed in a bending region of a display panel without an additional process, and a dead space of a display device is reduced.

DETAILED DESCRIPTION OF EMBODIMENTS

Figure 1:
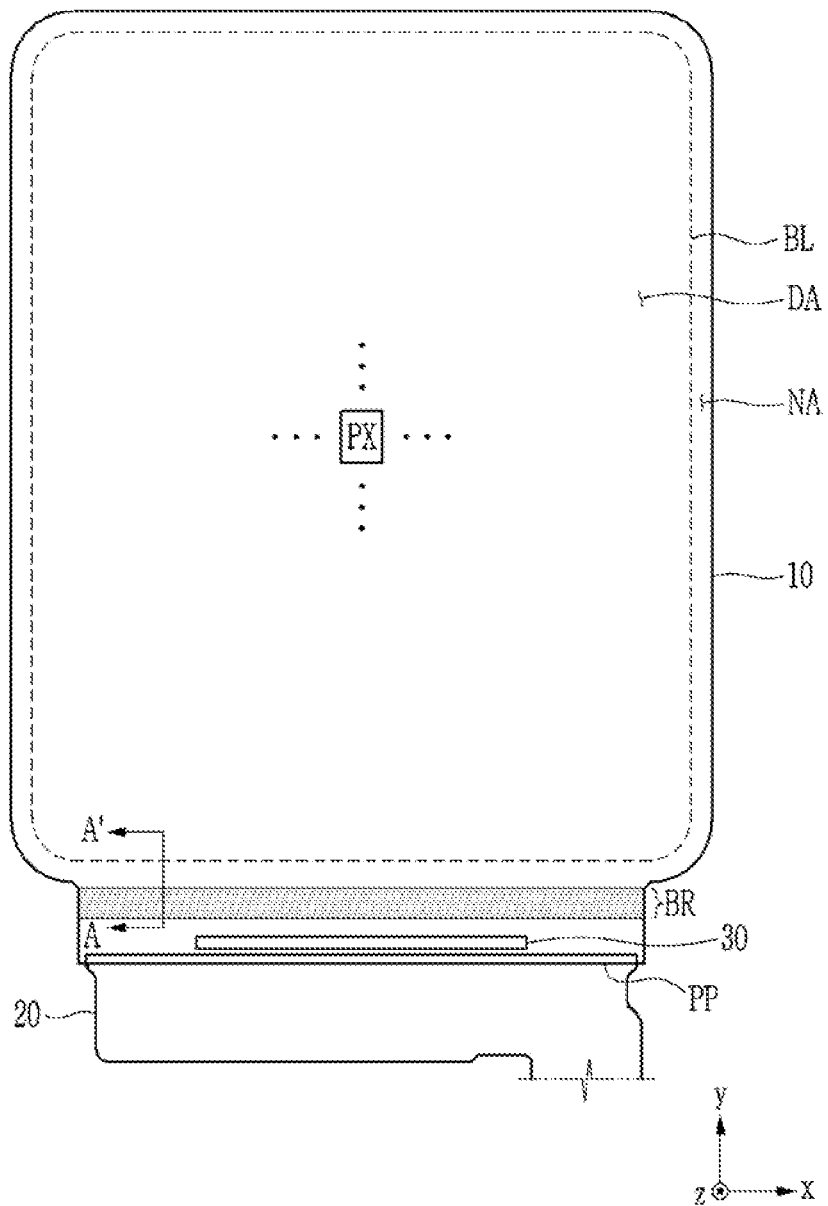
FIG. 1 illustrates a top plan view of a display device according to an embodiment of the present inventive concepts.

The present inventive concepts will be described more fully hereinafter with reference to the accompanying drawings, in which embodiments are shown.

A size and thickness of each element illustrated in the drawings are arbitrarily shown for ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification, unless explicitly described to the contrary, the word "comprise" and variations such as "comprises" or "comprising" will be understood to imply the inclusion of stated elements but not the exclusion of any other elements.

Throughout the specification, "connected" does not only mean when two or more elements are directly connected, but also when two or more elements are indirectly connected through other elements, and when they are physically connected or electrically connected, and further, it may be referred to by different names depending on a position or function, and may also be referred to as a case in which respective parts that are substantially integrated are linked to each other.

In the drawings, symbols x, y, and z are used to indicate directions. "x" indicates a first direction, "y" indicates a second direction perpendicular to the first direction, and "z" indicates a third direction perpendicular to the first direction and the second direction.

Figure 2:
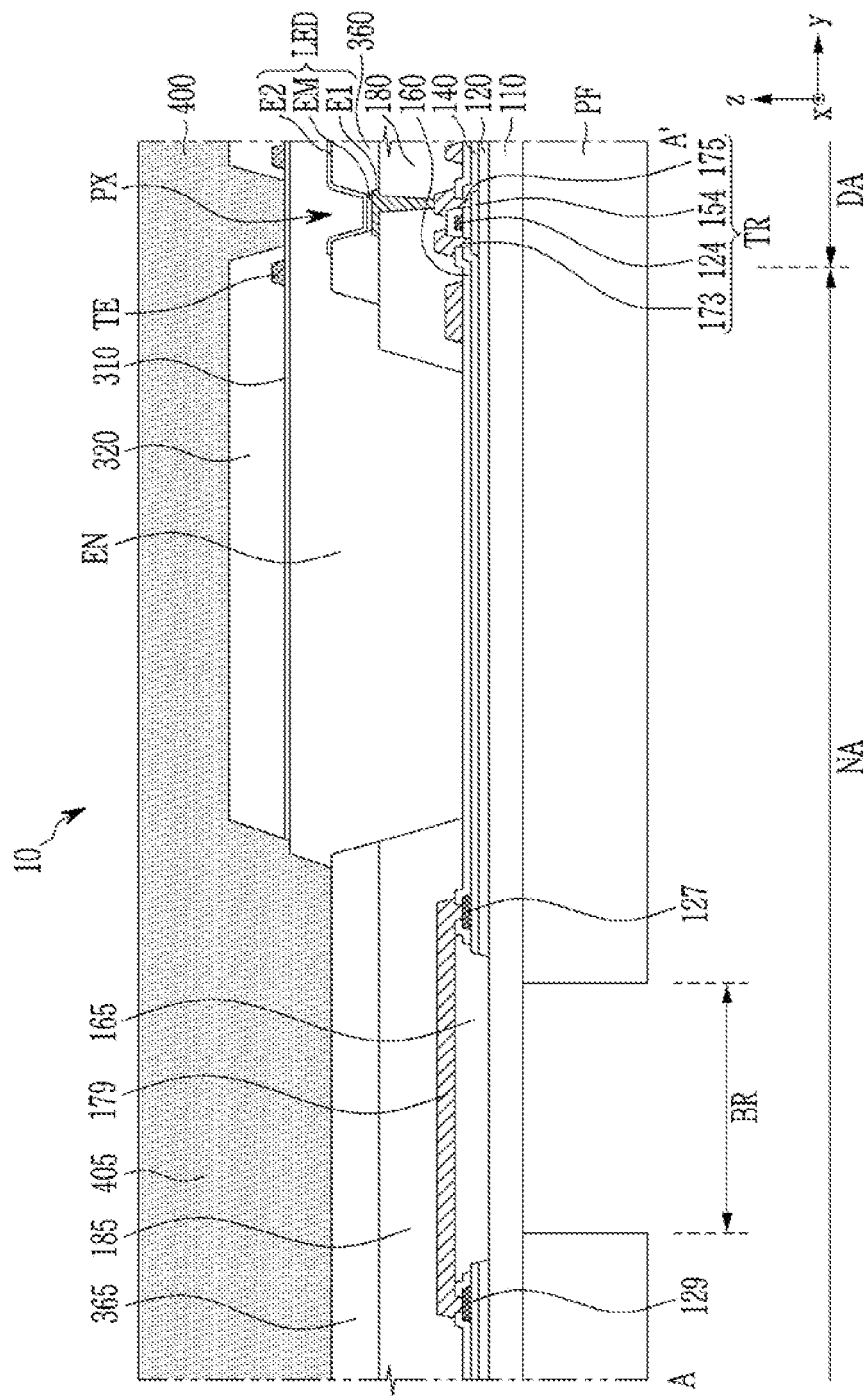
FIG. 2 illustrates a cross-sectional view of a display device taken along line A-A' of FIG. 1 according to an embodiment of the present inventive concepts.

FIG. 1 schematically illustrates a top plan view of a display device according to an embodiment of the present inventive concepts, and FIG. 2 illustrates a schematic cross-sectional view taken along line A-A' of FIG. 1 according to an embodiment of the present inventive concepts.

Referring to the embodiment of FIG. 1, the display device includes a display panel 10, a flexible printed circuit film 20 connected (e.g., bonded) to the display panel 10, and an integrated circuit chip 30.

The display panel 10 includes a display area DA for displaying an image, and a non-display area NA around the display area DA. For example, as shown in the embodiment of FIG. 1, the non-display area NA may completely surround the display area DA. However, embodiments of the present inventive concepts are not limited thereto. For example, in other embodiments the display area DA may extend to at least one edge of the display panel 10 and the non-display are NA may not surround one or more edges of the display area DA. The display area DA may correspond to a screen of the display panel 10. Elements and/or signal lines for generating and/or transmitting various signals to be applied to the display area DA may be disposed in the non-display area NA. In the embodiment of FIG. 1, the inside and outside of a line BL correspond to the display area DA and the non-display area NA, respectively.

Pixels PX are arranged in the display area DA of the display panel 10. Signal lines such as data lines and gate lines are also disposed in the display area DA. In an embodiment, the gate lines may extend in a first direction X (hereinafter, the "X direction") which may be a row direction and the data lines may extend in a second direction Y (hereinafter, the "Y direction") which may be a column direction. While the embodiment of FIG. 1 shows the X and Y direction substantially perpendicular to each other, embodiments of the present inventive concepts are not limited thereto and the X and Y directions may cross each other at different angles in other embodiments. The gate line and the data line are connected to each pixel PX to receive a gate signal (e.g., a scan signal) and a data voltage (e.g., a data signal) from these signal lines. Driving voltage lines for transmitting a driving voltage to the pixel PX may be disposed in the display area DA, and initializing voltage lines for transmitting an initializing voltage to the pixel PX may also be disposed in the display area DA. In an embodiment, the driving voltage line may substantially extend in the Y direction, and the initializing voltage line may substantially extend in the X direction.

The display panel 10 may include a touch sensor layer which includes touch electrodes that sense a user's contact or non-contact touch. The touch electrodes may be disposed in the display area DA.

The non-display area NA of the display panel 10 includes a pad portion PP. The pad portion PP includes pads corresponding to connection terminals for receiving signals from the outside of the display panel 10. As shown in the embodiment of FIG. 1, the pad portion PP may extend longitudinally in the X direction along the vicinity of an edge of the display panel 10. For example, the pad portion PP may be disposed along the vicinity of a lower edge of the non-display area NA of the display panel 10 (e.g., in the Y direction). However, embodiments of the present inventive concepts are not limited thereto. The flexible printed circuit film 20 may be bonded to the pad portion PP, and pads of the flexible printed circuit film 20 may be electrically connected to pads of the pad portion PP.

A driving unit for generating and/or processing various signals for driving the display panel 10 may be disposed in the non-display area NA of the display panel 10. The driving unit may include a data driver for applying a data voltage to the data line, a gate driver for applying a gate signal to the gate line, and a signal controller for controlling the data driver and the gate driver.

The gate driver may be integrated as a driving circuit in the non-display area NA of the display panel 10. In an embodiment, the driving circuit may be extend longitudinally in the Y direction in portions of the non-display area NA disposed at both lateral sides of the display area DA in the X direction (e.g., left and right sides in the X direction). In an embodiment, the driving circuit may include a shift register including stages that are connected to each other. Each stage may generate a gate signal and output it to the gate line.

As shown in the embodiment of FIG. 1, the data driver and the signal controller may be provided as an integrated circuit chip (also referred to as a driving IC chip) 30, and the integrated circuit chip 30 may be mounted on the non-display area NA of the display panel 10. For example, the integrated circuit chip 30 may be mounted on a lower portion of the non-display area NA (e.g., in the Y direction). However, embodiments of the present inventive concepts are not limited thereto. In an embodiment, the integrated circuit chip 30 may be mounted on the flexible printed circuit film 20 or the like to be electrically connected to the display panel 10.

The display panel 10 includes a bending region BR. The bending region BR may be disposed in the non-display area NA between the display area DA and the pad portion PP (e.g., in the Y direction). The bending region BR may extend across the non-display area NA of the display panel 10 in the X direction. The display panel 10 may be bent to have a predetermined radius of curvature. For example, in an embodiment, the predetermined radius of curvature may have an inner diameter of about 1 mm or less, about 0.5 mm or less, or about 0.3 mm or less, based on a bending axis parallel to the X direction in the bending region BR. When the display panel 10 is a top emission type, the pad portion PP and the flexible printed circuit film 20 which are farther from the display area DA (e.g., in the Y direction) than the bending region BR are bent so as to be disposed on a rear surface of the display panel 10. For example, when the display panel 10 is applied to an electronic device, the display panel 10 may be bent as described above. In an embodiment, the display panel 10 may include one bending axis that the bending region BR may be bent around or may include two or more bending axes that the display panel 10 may be bent around. In an embodiment, the bending region BR may be disposed in both the display area DA and the non-display area NA, may be disposed solely in the non-display area DA or may be disposed solely in the display area DA.

A cross-sectional structure of the display panel 10 will be described with reference to the embodiment of FIG. 2. For convenience of explanation, the display area DA will be first described, then for the non-display area NA including the bending region BR, differences from the display area DA will be mainly described.

The display panel 10 includes a substrate 110 and various layers, wires, and elements formed thereon. Although a large number of pixels PX are disposed in the display area DA of the display panel 10, only one pixel PX is briefly illustrated and described for convenience of illustration. Each pixel PX includes a plurality of transistors, a capacitor, and a light emitting diode (LED) as a light emitting element. However, a stacked structure of the display panel 10 will be described based on one transistor TR and one light emitting diode (LED) connected to the transistor TR for convenience of explanation.

In an embodiment, the substrate 110 may be a flexible substrate made of a polymer, such as at least one compound selected from polyimide, a polyamide, and polyethylene terephthalate. However, embodiments of the present inventive concepts are not limited thereto. The substrate 110 may include a barrier layer that prevents moisture, oxygen, and the like from penetrating therethrough. The substrate 110 may include a display area DA and a non-display area NA which includes the bending region BR as previously described. For example, the substrate 110 may include one or more polymer layers and one or more barrier layers, and a polymer layer and a barrier layer may be alternately stacked, such as in the Z direction which is a thickness direction of the display panel 10. In an embodiment, a lowermost layer of the substrate 110 may be a polymer layer and an uppermost layer thereof may be a barrier layer. In an embodiment, the barrier layer may include an inorganic insulating material such as at least one compound selected from silicon oxide ($SiO_x$), a silicon nitride ($SiN_x$), and the like.

A substrate buffer layer 120 may be disposed on the substrate 110. In a process of forming a semiconductor layer 154, the substrate buffer layer 120 may block impurities that may diffuse from the substrate 110 to the semiconductor layer 154 and reduce stress applied to the substrate 110. In an embodiment, the substrate buffer layer 120 may include an inorganic insulating material such as a silicon oxide and a silicon nitride. However, embodiments of the present inventive concepts are not limited thereto.

The semiconductor layer 154 of the transistor TR may be disposed on the substrate buffer layer 120. The semiconductor layer 154 may include a source region, a drain region, and a channel region disposed between the source region and the drain region. In an embodiment, the semiconductor layer AL may include a semiconductor material such as at least one compound selected from polycrystalline silicon, an oxide semiconductor, and amorphous silicon. However, embodiments of the present inventive concepts are not limited thereto.

A first insulating layer 140 may be disposed on the semiconductor layer 154. In an embodiment, the first insulating layer 140 may include an inorganic insulating material such as a silicon oxide and a silicon nitride. The first insulating layer 140 may be referred to as a gate insulating layer.

A first conductor that may include a gate electrode 124, a gate line, and the like may be disposed on the first insulating layer 140. In an embodiment, the first conductor may include a metal such as at least one compound selected from molybdenum (Mo), copper (Cu), aluminum (Al), silver (Ag), chromium (Cr), tantalum (Ta), and titanium (Ti).

A second insulating layer 160 may be disposed on the first insulating layer 140 and the first conductor. In an embodiment, the second insulating layer 160 may include an inorganic insulating material such as a silicon oxide and a silicon nitride. The second insulating layer 160 may be referred to as an interlayer insulating layer.

A second conductor that may include a source electrode 173, a drain electrode 175, a data line, a driving voltage line, and the like may be disposed on the second insulating layer 160. The source electrode 173 and the drain electrode 175 may be connected to the source region and the drain region of the semiconductor layer 154 through openings of the second insulating layer 160 and the first insulating layer 140, respectively.

In an embodiment, the second conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta), or a metal alloy thereof. For example, the second conductor may be a multilayer such as titanium/aluminum/titanium, titanium/copper/titanium, or molybdenum/aluminum/titanium. However, embodiments of the present inventive concepts are not limited thereto.

The gate electrode 124, the source electrode 173, and the drain electrode 175 form a transistor TR together with the semiconductor layer 154. In the embodiment of FIG. 1, the transistor TR is illustrated as a top-gate type. However, embodiments of the present inventive concepts are not limited thereto and the structure of the transistor TR may be variously changed.

A third insulating layer 180 may be disposed on the second insulating layer 160 and the second conductor. In an embodiment, the third insulating layer 180 may include an organic insulating material such as at least one compound selected from a polyimide, an acrylic polymer, and a siloxane polymer. However, embodiments of the present inventive concepts are not limited thereto. The third insulating layer 180 may serve to flatten the display device above the transistor TR.

A first electrode E1 of a light emitting diode LED may be disposed on the third insulating layer 180. The first electrode E1 is connected to the drain electrode 175 through an opening of the third insulating layer 180 to receive a data signal for controlling luminance of the light emitting diode LED. The transistor TR to which the first electrode E1 is connected may be a driving transistor or a transistor electrically connected to the driving transistor. In an embodiment, the first electrode E1 may include a metal such as at least one compound selected from silver (Ag), nickel (Ni), gold (Au), platinum (Pt), aluminum (Al), copper (Cu), aluminum neodymium (AlNd), and aluminum nickel lanthanum (AlNiLa). The first electrode E1 may include a transparent conductive material such as an indium tin oxide (ITO) or an indium zinc oxide (IZO). However, embodiments of the present inventive concepts are not limited thereto. In an embodiment, the first electrode E1 may be a multilayer such as ITO/silver/ITO or ITO/aluminum. The first electrode E1 may be referred to as a pixel electrode.

A fourth insulating layer 360 provided with an opening (e.g., a first opening OP1 shown in FIG. 5) overlapping the first electrode E1 in a thickness direction of the display panel 10 (e.g., in the Z direction) may be disposed on the third insulating layer 180. The opening of the fourth insulating layer 360 may define a pixel area and the fourth insulating layer 360 may be referred to as a pixel defining layer. The fourth insulating layer 360 may include an organic insulating material.

A light emitting member EM is disposed on the first electrode E1, and a second electrode E2 is disposed on the light emitting member EM. In an embodiment, the light emitting member EM includes a light emitting layer, and may include one or more additional layers such as an electron injecting layer, an electron transporting layer, a hole injecting layer, and a hole transporting layer. The second electrode E2 may have light transmittance by forming a thin layer of a metal having a low work function such as at least one compound selected from calcium (Ca), barium (Ba), magnesium (Mg), aluminum (Al), and silver (Ag). The second electrode E2 may be formed of a transparent conductive material such as ITO or IZO. The second electrode E2 may be referred to as a common electrode.

The first electrode E1, the light emitting member EM, and the second electrode E2 may form a light emitting diode LED. In an embodiment, the light emitting diode LED is an organic light emitting diode. However, embodiments of the present inventive concepts are not limited thereto. The first electrode E1 and the second electrode E2 may be an anode and a cathode of the light emitting diode LED, respectively.

An encapsulation layer EN may be disposed on the second electrode E2. The encapsulation layer may encapsulate the light emitting diode LED to prevent moisture or oxygen from penetrating from the outside. In an embodiment, the encapsulation layer EN may be a thin film encapsulation layer including at least one inorganic material layer and at least one organic material layer. In an embodiment, the encapsulation layer EN may cover the entire display area DA, and a lateral edge of the encapsulation layer EN (e.g., lateral edge in the Y direction) may be disposed in the non-display area NA.

A buffer layer 310 may be disposed on the encapsulation layer EN. In an embodiment, the buffer layer 310 may include an inorganic insulating material such as a silicon nitride or a silicon oxide. For example, as shown in the embodiment of FIG. 2, a lower surface of the buffer layer 310 may directly contact an upper surface of the encapsulation layer EN.

A touch electrode TE may be disposed on the buffer layer 310. In an embodiment, the touch electrode TE may have a mesh shape having an opening overlapping a pixel area in a thickness direction of the display panel 10 (e.g., in the Z direction) which corresponds to an opening of the fourth insulating layer 360 or a light emitting region of the light emitting diode LED. In an embodiment, the touch electrode TE may include a metal such as at least one compound selected from aluminum (Al), copper (Cu), titanium (Ti), molybdenum (Mo), silver (Ag), chromium (Cr), and nickel (Ni). The touch electrode TE may include a conductive nanomaterial such as a silver nanowire or a carbon nanotube.

A passivation layer 320 may be disposed on the touch electrode TE. For example, as shown in the embodiment of FIG. 2, a lower surface of the passivation layer 320 may directly contact upper and lateral side surfaces of the touch electrode TE to cover the touch electrode TE and an upper surface of the buffer layer 310. In an embodiment, the passivation layer 320 may include an organic insulating material such as an acrylic polymer. However, embodiments of the present inventive concepts are not limited thereto. The passivation layer 320 may be formed of a photoresist. The passivation layer 320 may be provided with an opening (e.g., a second opening OP2 shown in FIG. 5) that overlaps in a thickness direction of the display panel 10 (e.g., in the Z direction) the opening of the fourth insulating layer 360 which is a light emitting region of the light emitting diode LED. The passivation layer 320 may not be disposed in the bending region BR and the passivation layer 320 may not overlap the bending region BR in a thickness direction of the display panel 10 (e.g., the Z direction).

The buffer layer 310, the touch electrode TE, and the passivation layer 320 may form a touch sensor layer.

A flattening layer 400 may be disposed on the passivation layer 320. For example, as shown in the embodiment of FIG. 2, a lower surface of the flattening layer 400 may directly contact an upper surface and lateral side surfaces of the passivation layer 320. In an embodiment, the flattening layer 400 may have a higher refractive index than the passivation layer 320. In an embodiment, the flattening layer 400 may include an organic material such as an acrylic polymer or a siloxane polymer, and may include inorganic nanoparticles to increase a refractive index. In an embodiment, the flattening layer 400 may be applied using an inkjet printing method, a screen printing method, or the like. The flattening layer 400 may be applied in the display area DA as well as in the non-display area NA including the bending region BR. In an embodiment, the flattening layer 400 may be formed to have a thickness of about 50 μm or less, for example, about 20 μm.

The passivation layer 320 and the flattening layer 400 may be combined to form a light-control pattern. The light-control pattern will be described later.

An anti-reflection layer for reducing external light reflection may be disposed on the passivation layer 320.

A protection film PF may be disposed under the substrate 110. In an embodiment, the protection film PF may be a film made of a polymer such as at least one compound selected from polyethylene terephthalate, polyethylene naphthalate, a polyimide, and polyethylene sulfide. The protection film PF may be attached to the substrate 110 by an adhesive.

A connecting wire 179 for electrically connecting a first wire 127 and a second wire 129 disposed at both lateral sides of the bending region BR (e.g., in the Y direction) may be disposed in the bending region BR. Accordingly, signals (e.g., a data signal, a control signal, and a voltage signal) outputted from the integrated circuit chip 30, and signals (e.g., a driving voltage and a common voltage) inputted to the pad of the pad portion PP, may be transmitted to a pixel of the display area DA and a driving unit of the non-display area NA, etc. through the second wire 129, the connecting wire 179, and the first wire 127. In an embodiment, the connecting wire 179 may be made of a metal having good flexibility and a small Young's modulus. In an embodiment, the connecting wire 179 may be made of the same material in the same process as the source electrode 173 and the drain electrode 175. When the flexibility of the connecting wire 179 increases, a stress to strain ratio becomes small, so that a risk of deterioration (e.g., cracking) or disconnection during bending of the bending region BR may be reduced.

In the bending region BR, a first protection layer 165 may be disposed between the substrate 110 and the connecting wire 179 (e.g., in the Z direction). In an embodiment, the first protection layer 165 may include an organic insulating material such as a polyimide, an acrylic polymer, or a siloxane polymer. However, embodiments of the present inventive concepts are not limited thereto.

A second protection layer 185 and/or a third protection layer 365 may be disposed on the connecting wire 179. In an embodiment, the second protection layer 185 may be formed of the same material in the same process as the third insulating layer 180. The third protection layer 365 may be formed of the same material in the same process as the fourth insulating layer 360.

A bending protection layer 405 for protecting the bending region BR is disposed on the third protection layer 365. For example, as shown in the embodiment of FIG. 2, a lower surface of the bending protection layer 405 may directly contact an upper surface of the third protection layer 365. The bending protection layer 405 may protect the bending region BR against external impact and relieve tensile stress of the connecting wire 179. The bending protection layer 405 may adjust a position of a neutral surface thereof to minimize deformation of the connecting wire 179 when the bending region BR is bent. The bending protection layer 405 may be referred to as a stress neutralization layer. The bending protection layer 405 may be disposed at an uppermost region of the bending region BR (e.g., in the Z direction), and may completely cover the bending region BR.

As shown in the embodiment of FIG. 2, the flattening layer 400 of the display area DA may continuously extend to the bending region BR (e.g., in the Y direction) to form the bending protection layer 405. In an embodiment, the bending protection layer 405 may be a portion of the flattening layer 400, or may be formed of the same material in the same process as the flattening layer 400. For example, in embodiments in which the bending protection layer 405 is formed of the same material in the same process as the flattening layer 400, there may be one or more gaps between the flattening layer 400 and the bending protection layer 405 disposed in the bending region BR. Therefore, an additional process for forming the bending protection layer 405 is not required. In addition, the bending protection layer 405 may reduce a tolerance margin and may be formed with a relatively thin thickness (e.g., about 20 μm) compared to a bending protection layer formed by applying an organic material on the bending region BR. Therefore, the size of the non-display area NA and a dead space may be reduced.

In an embodiment, the barrier layer, the substrate buffer layer 120, the first insulating layer 140, the second insulating layer 160, and the buffer layer 310, which may be inorganic insulating layers including inorganic insulating materials, may be removed from the bending region BR. The removal of the substrate buffer layer 120, the first insulating layer 140, the second insulating layer 160, and the buffer layer 310 from the bending region BR may help prevent the inorganic insulating layer from cracking when the bending region BR is bent which may damage the wires in the bending region BR.

As shown in the embodiment of FIG. 2, the protection film PF may be disposed to cover an entire portion of the rear surface of the substrate 110 except for in the bending region BR. The omission of the protection film PF in the bending region BR may reduce the bending stress and the radius of curvature of the bending region BR.

Figure 3:
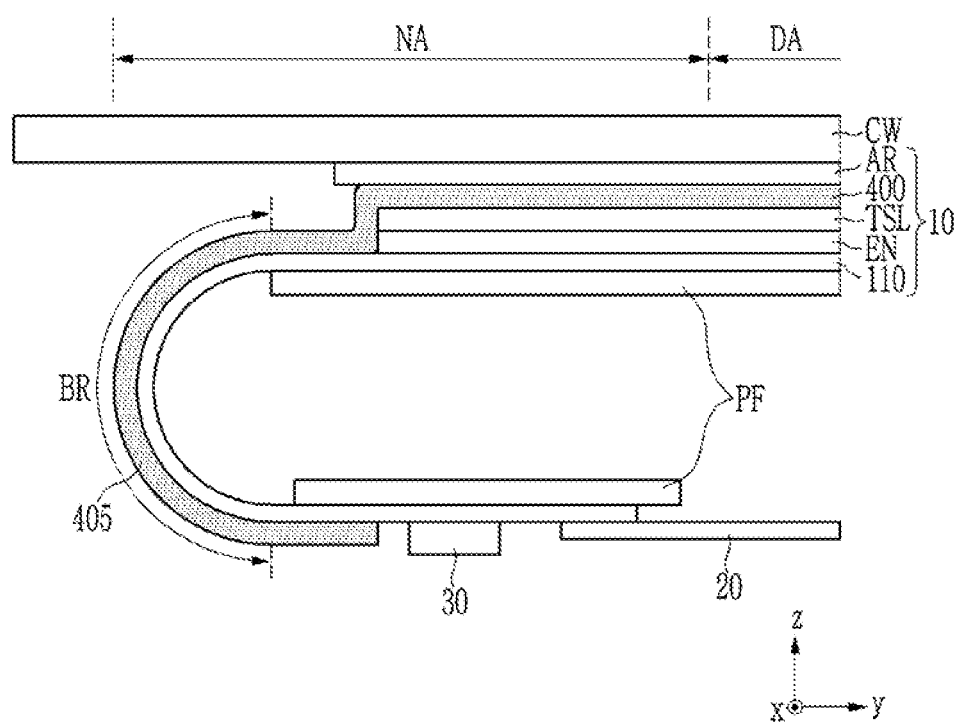
FIG. 3 illustrates a cross-sectional view of a display device in a state in which a bending region is bent according to an embodiment of the present inventive concepts.

FIG. 3 illustrates a schematic cross-sectional view of a display device in a state in which a bending region BR is bent according to an embodiment of the present inventive concepts.

Referring to the embodiment of FIG. 3, the display panel 10 may further include an anti-reflection layer AR disposed on the flattening layer 400. For example, a lower surface of the anti-reflection layer AR may directly contact an upper surface of the flattening layer 400. In an embodiment, the anti-reflection layer AR may include a polarizer or a polarization layer.

The display device may further include a cover window CW disposed on the display panel 10. The cover window CW is a cover that protects against external impact. In an embodiment, the cover window CW may be made of a transparent and rigid material such as glass or plastic so that a user may view an image displayed on a screen of the display panel 10.

The bending region BR of the display panel 10 may be bent with a predetermined radius of curvature. As shown in the embodiment of FIG. 3, when the bending region BR is bent, the flexible printed circuit film 20 and the integrated circuit chip 30 may be disposed on the rear surface of the display panel 10 and may face opposite (e.g., in the Z direction) to the display area DA in which an image is displayed. Accordingly, a width (e.g., length in the Y direction) of the non-display area NA which is a dead space in an electronic device may be reduced. In an embodiment, a spacer, such as a double-sided tape, may be disposed in a space (e.g., in the Z direction) between the protection films PF facing each other when the bending region BR is bent, so that a bending state of the bending region BR and the radius of curvature of the bending region BR may be maintained.

The flattening layer 400 disposed on the touch sensor layer TSL in the display area DA may also be disposed in the bending region BR. The bending protection layer 405 may be composed of the portion of the flattening layer 400 in the bending region BR. As shown in the embodiment of FIG. 3, the bending protection layer 405 composed of the flattening layer 400 may also extend to areas adjacent to the bending region BR on both sides of the bending region. The flattening layer 400 may extend toward the bending region BR (e.g., in the Y direction) while covering an upper and lateral end surface of the touch sensor layer TSL, an upper and lateral end surface of the passivation layer 320 and an upper and lateral end surface of the encapsulation layer EN.

Figure 4:
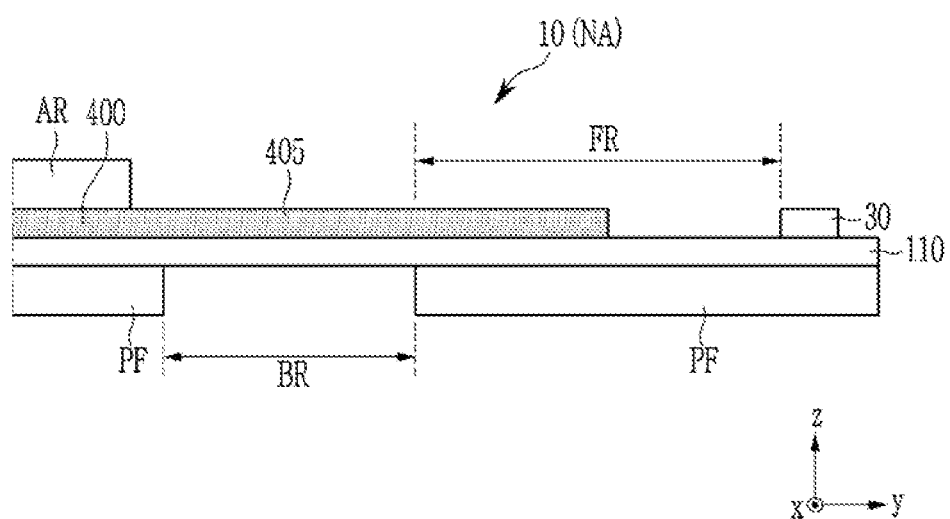
FIG. 4 illustrates a cross-sectional view of a region for forming a flattening layer according to an embodiment of the present inventive concepts.

FIG. 4 illustrates a schematic cross-sectional view of a region for forming the flattening layer 400 according to an embodiment of the present inventive concepts.

Referring to the embodiment of FIG. 4, layers disposed between the substrate 110 and the flattening layer 400 (e.g., in the Z direction) are omitted for convenience of explanation, and a state of the display device in an unbent state (e.g., before the bending of the non-display area NA including the bending region BR of the display panel 10) is schematically illustrated. As described above, the flattening layer 400 may be formed to extend from the display area DA to the bending region BR (e.g., in the Y direction). For example, in an embodiment, the flattening layer 400 may extend continuously from the display area DA to the bending region BR. However, embodiments of the present inventive concepts are not limited thereto. The portion of the flattening layer 400 extending to the bending region provides a bending protection layer 405 that completely covers the bending region BR. The flattening layer 400 may be formed so that a lateral edge of a portion of the flattening layer 400 that does not form a portion of the bending protection layer 405 is disposed in an intermediary region FR between the bending region BR and the integrated circuit chip 30 (e.g., in the Y direction when the display panel is in an unbent state). In embodiments in which the flattening layer 400 forms a bending protection layer 405 that does not completely cover the bending region BR, the bending protection layer 405 may be insufficient. In embodiments in which the flattening layer 400 is formed up to an area in which the integrated circuit chip 30 is disposed, mounting of the integrated circuit chip 30 may be difficult.

Figure 5:
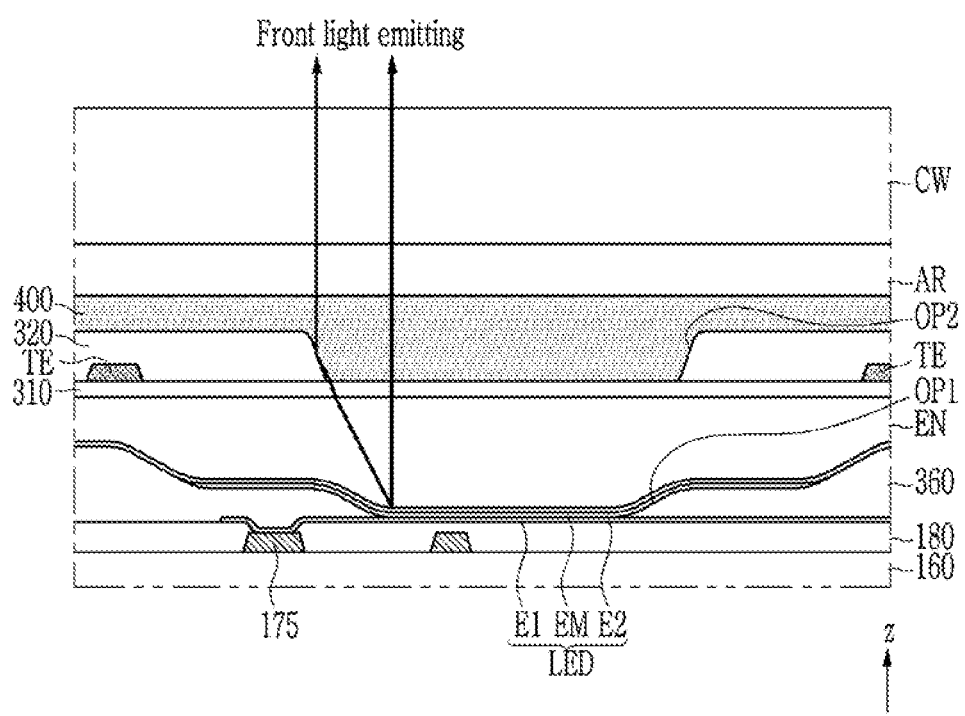
FIG. 5 illustrates a cross-sectional view of approximately one pixel area in a display device according to an embodiment of the present inventive concepts.

FIG. 5 illustrates a schematic cross-sectional view of approximately one pixel area in a display device according to an embodiment of the present inventive concepts.

Features related to the aforementioned light-control pattern will be described in more detail with reference to the embodiment of FIG. 5. In FIG. 5, layers disposed below the second insulating layer 160 in the display panel 10 are not illustrated for convenience of explanation.

As shown in the embodiment of FIG. 5, the passivation layer 320 covering the touch electrode TE formed on the buffer layer 310 may include a second opening OP2 overlapping a light emitting surface (or pixel area) of the light emitting diode LED corresponding to a first opening OP1 of the fourth insulating layer 360. In an embodiment, the passivation layer 320 may have a refractive index in a range of about 1.5 or less. For example, the refractive index of the passivation layer 320 may be in a range of about 1.4 to about 1.5.

The flattening layer 400 disposed on the passivation layer 320 may be formed to fill the second opening OP2 of the passivation layer 320. An upper surface of the flattening layer 400 may be flat. The flattening layer 400 may contact lateral edges of the passivation layer 320 and an upper surface of the buffer layer 310 in the second opening OP2. The flattening layer 400 may also cover a lateral end of the passivation layer 320 disposed adjacent to the bending region BR. The flattening layer 400 may have a higher refractive index than the passivation layer 320. In an embodiment, the flattening layer 400 may be an organic layer including an organic material such as an acrylic resin, and may include at least one material selected from zirconium oxide ($ZrO_x$) particles, titanium oxide ($TiO_x$) particles, or an aluminum oxide ($AlO_x$) for increasing a refractive index. In an embodiment, the flattening layer 400 may have a refractive index of about 1.6 or more.

The passivation layer 320 having a relatively lower refractive index and the flattening layer 400 having a relatively higher refractive index disposed in the second opening OP2 may form a condensing lens (e.g., a concave lens). Therefore, the passivation layer 320 and the flattening layer 400 may form a light-control pattern throughout the display area DA. Light emitted in an oblique direction from the light emitting diode LED may be changed to be reflected, refracted, and/or diffracted by the condensing lens to be directed toward the front surface of the display area DA. For example, the condensing lens may refract (e.g., fully reflect) the light emitted in the oblique direction from the light emitting diode LED in a front direction by an inclined surface of the second opening OP2. Therefore, light emitting efficiency and front luminance of the display device may be improved, and color mixing between adjacent pixels may be reduced.

Figure 6:
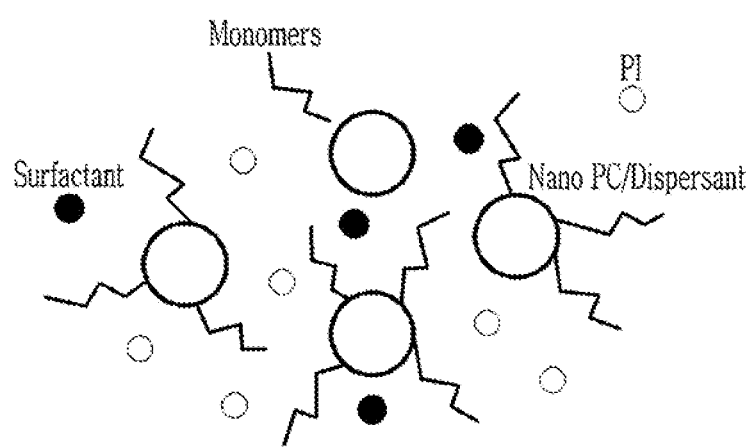
FIG. 6 illustrates a composition of a material of a flattening layer according to an embodiment of the present inventive concepts.

FIG. 6 illustrates a composition of a material of a flattening layer 400 according to an embodiment of the present inventive concepts.

A material of the flattening layer 400 forming the bending protection layer 405 in the bending region BR will be schematically described with reference to the embodiment of FIG. 6.

The material of the flattening layer 400 may be a photo-curable resin including a monomer, a nanoparticle, a dispersant, a surfactant, a photoinitiator (PI), or the like. The monomer may be monoacrylate. The monomer may be of a solventless type, and a proportion of a high-viscosity monomer may be higher than a proportion of a low-viscosity monomer for improving swelling (e.g., a material flow after curing). For example, in an embodiment, the material of the flattening layer 400 may have a proportion of a high-viscosity monomer to a low-viscosity monomer of about 8:2. The nanoparticles are intended to have high refractive properties. In an embodiment, the nanoparticles may have a size of about 50 nm or less, for example, about 25 nm, for improving haze. In an embodiment, the nanoparticles may include zirconium oxide particles.

Figure 7:
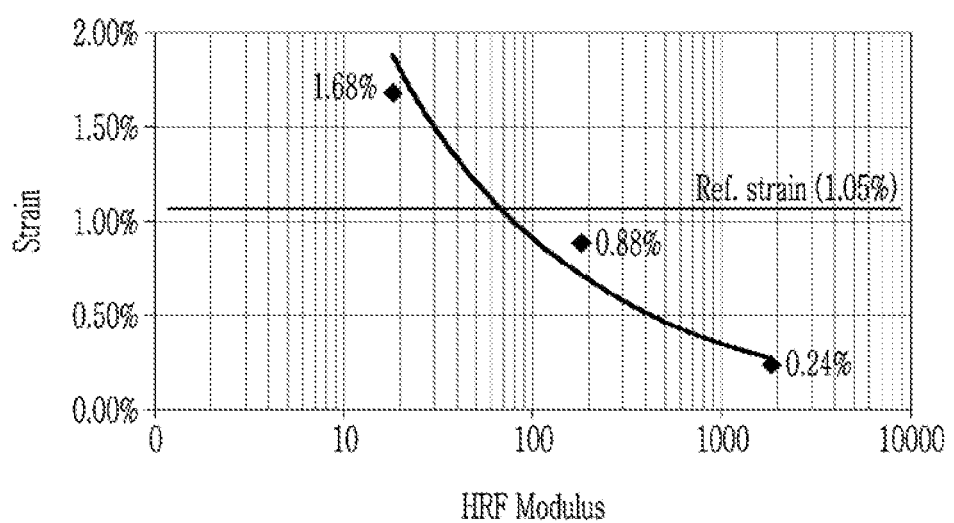
FIG. 7 illustrates a graph of a relationship between a modulus of a bending protection layer and deformation of a wire of a bending region.

FIG. 7 illustrates a graph of a relationship between a modulus of a bending protection layer 405 and deformation of a wire of a bending region BR.

FIG. 7 illustrates a strain of the connecting wire 179 disposed at a starting point (corresponding to a lateral edge of the protection film PF in the non-display area NA) of the bending region BR in the bent display panel 10 as shown in the embodiment of FIG. 5. In instances in which a modulus of the bending protection layer 405 is relatively small, deformation of the connecting wire 179 may increase and the connecting wire 179 may be damaged, such as cracked or disconnected. When the modulus of the bending protection layer 405 is greater than or equal to about 70 MPa, the strain is less than or equal to about 1.05%. Therefore, a risk that the connecting wire 179 is damaged (e.g., cracked or disconnected) may be significantly reduced. Therefore, in an embodiment, the flattening layer 400 and the bending protection layer 405 may have a modulus of about 70 MPa or more to protect the bending region BR.

While the present inventive concepts have been described in connection with embodiments, it is to be understood that the present inventive concepts are not limited to the disclosed embodiments. Instead, the present inventive concepts include various modifications and equivalent arrangements.

What is claimed is:

1. A display device, comprising:
a display panel including a display area and a bending region;
wherein the display panel includes:
a light emitting diode disposed in the display area;
an encapsulation layer encapsulating the light emitting diode;
a light-control pattern disposed on the encapsulation layer, the light-control pattern including a passivation layer and a flattening layer, wherein the flattening layer extends from the display area to the bending region; and
a bending protection layer disposed in the bending region, the bending protection layer is composed of a portion of the flattening layer in the bending region,
wherein the passivation layer has an opening overlapping a light emitting region of the light emitting diode in a thickness direction of the display panel, and
wherein the flattening layer is disposed on the passivation layer and fills the opening.

2. The display device of claim 1, wherein the flattening layer continuously extends from the display area to the bending region.

3. The display device of claim 1, further comprising:
an integrated circuit chip mounted on the display panel;
wherein the bending region is disposed between the display area and the integrated circuit chip, and
wherein a portion of the flattening layer disposed between the bending region and the integrated circuit chip forms a lateral end of the flattening layer.

4. The display device of claim 1, wherein:
the display panel further includes a buffer layer disposed between the encapsulation layer and the passivation layer; and
the flattening layer directly contacts lateral edges of the passivation layer and an upper surface of the buffer layer in the opening.

5. The display device of claim 1, wherein the flattening layer covers a lateral end of the passivation layer disposed adjacent to the bending region.

6. The display device of claim 1, wherein:
the display panel further includes a buffer layer disposed on the encapsulation layer and a touch electrode disposed on the buffer layer; and
the passivation layer covers the touch electrode.

7. The display device of claim 1, wherein the bending protection layer is an uppermost layer in the bending region.

8. The display device of claim 1, wherein the passivation layer does not overlap the bending region in a thickness direction of the display panel.

9. A display device comprising:
a display panel including a display area and a bending region;
wherein the display panel includes:
a light emitting diode disposed in the display area;
an encapsulation layer encapsulating the light emitting diode;
a light-control pattern disposed on the encapsulation layer, the light-control pattern including a passivation layer and a flattening layer, wherein the flattening layer extends from the display area to the bending region; and
a bending protection layer disposed in the bending region, the bending protection layer is composed of a portion of the flattening layer in the bending region, and
wherein the flattening layer covers a lateral end of the encapsulation layer disposed adjacent to the bending region.

10. A display device comprising:
a substrate including a display area and a non-display area, the non-display area including a bending region;
a light emitting diode disposed in the display area;
an encapsulation layer covering the display area to encapsulate the light emitting diode; and
a flattening layer disposed on the encapsulation layer in the display area and including an organic material, the flattening layer continuously extends from the display area to the bending region;
a bending protection layer covering the bending region, wherein the bending protection layer is composed of the flattening layer in the bending region.

11. The display device of claim 10, further comprising:
an integrated circuit chip disposed in the non-display area;
the bending region is disposed between the display area and the integrated circuit chip; and
a portion of the flattening layer disposed between the bending region and the integrated circuit chip forms a lateral end of the flattening layer.

12. The display device of claim 10, wherein the bending protection layer is an uppermost layer in the bending region.

13. The display device of claim 10, further comprising:
a connecting wire disposed in the bending region; and
a first organic insulating layer is disposed between the connecting wire and the bending protection layer in the bending region.

14. The display device of claim 13, wherein:
a second organic insulating layer is disposed between the substrate and the encapsulation layer in the display area; and
the second organic insulating layer is formed of a same material as the first organic insulating layer.

15. The display device of claim 10, further comprising:
a passivation layer disposed between the encapsulation layer, the passivation layer including an opening overlapping a light emitting region of the light emitting diode in a thickness direction of the display device,
wherein a portion of the flattening layer is disposed in the opening.

16. The display device of claim 15, further comprising:
a buffer layer disposed between the encapsulation layer and the passivation layer,
wherein the flattening layer directly contacts lateral edges of the passivation layer and an upper surface of the buffer layer in the opening.

17. The display device of claim 15, wherein the flattening layer covers a lateral end of the passivation layer and a lateral end of the encapsulation layer disposed adjacent to the bending region.

18. The display device of claim 15, further comprising:
a buffer layer disposed on the encapsulation layer, and a touch electrode disposed on the buffer layer; and
the passivation layer covers the touch electrode.

19. The display device of claim 18, wherein
the passivation layer and the buffer layer do not overlap the bending region in a thickness direction of the display device.

* * * * *